(12) United States Patent
Inoue et al.

(10) Patent No.: US 8,153,534 B2
(45) Date of Patent: Apr. 10, 2012

(54) DIRECT OXIDATION METHOD FOR SEMICONDUCTOR PROCESS

(75) Inventors: Hisashi Inoue, Nirasaki (JP); Masataka Toiya, Nirasaki (JP); Yoshikatsu Mizuno, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/025,738

(22) Filed: Feb. 11, 2011

(65) Prior Publication Data

US 2011/0129604 A1 Jun. 2, 2011

Related U.S. Application Data

(62) Division of application No. 11/902,180, filed on Sep. 19, 2007, now abandoned.

(30) Foreign Application Priority Data

Sep. 22, 2006 (JP) ................................. 2006-257125

(51) Int. Cl.
*H01L 21/31* (2006.01)

(52) U.S. Cl. ......... 438/758; 438/770; 438/778; 438/787

(58) Field of Classification Search .................. 438/758, 438/765, 769, 770, 778, 787, 788, 789, 790; 118/715
See application file for complete search history.

(56) References Cited

U.S. PATENT DOCUMENTS

| | | | |
|---|---|---|---|
| 5,252,133 A | 10/1993 | Miyazaki et al. | |
| 6,146,461 A | 11/2000 | Yang et al. | |
| 7,605,095 B2 * | 10/2009 | Ikeuchi et al. | 438/787 |
| 7,795,158 B2 * | 9/2010 | Fujita et al. | 438/770 |
| 2002/0124800 A1 | 9/2002 | Moriyama | |
| 2003/0111013 A1 | 6/2003 | Oosterlaken et al. | |
| 2005/0098107 A1 | 5/2005 | Du Bois et al. | |
| 2005/0164518 A1 | 7/2005 | Hasebe et al. | |
| 2005/0196533 A1 * | 9/2005 | Hasebe et al. | 427/248.1 |
| 2005/0241578 A1 | 11/2005 | Aoki et al. | |

(Continued)

FOREIGN PATENT DOCUMENTS

JP 57-001232 1/1982

(Continued)

OTHER PUBLICATIONS

Chinese Office Action mailed on Apr. 30, 2010 for Chinese Application No. 200710192901.5 w/ English translation.

(Continued)

*Primary Examiner* — Kevin M Picardat
(74) *Attorney, Agent, or Firm* — Smith, Gambrell & Russell, LLP

(57) ABSTRACT

An oxidation method for performing direct oxidation includes respectively supplying an oxidizing gas and a deoxidizing gas to the process field, and directly oxidizing a surface target substrates by use of oxygen radicals and hydroxyl group radicals generated by a reaction between the oxidizing gas and the deoxidizing gas. The oxidizing gas is supplied through an oxidizing gas nozzle extending over a vertical length corresponding to the process field and is spouted from a plurality of gas spouting holes formed on the oxidizing gas nozzle and arrayed over the vertical length corresponding to the process field. The deoxidizing gas is supplied through a plurality of deoxidizing gas nozzles having different heights respectively corresponding to a plurality of zones of the process field arrayed vertically and is spouted from gas spouting holes respectively formed on the deoxidizing gas nozzles each at height of a corresponding zone.

11 Claims, 9 Drawing Sheets

U.S. PATENT DOCUMENTS

| | | |
|---|---|---|
| 2006/0032442 A1 | 2/2006 | Hasebe |
| 2006/0183343 A1 | 8/2006 | Suzuki et al. |
| 2007/0010072 A1 | 1/2007 | Bailey et al. |
| 2008/0107824 A1* | 5/2008 | Hasebe et al. ................ 427/576 |

FOREIGN PATENT DOCUMENTS

| | | |
|---|---|---|
| JP | 03-140453 | 6/1991 |
| JP | 04-018727 | 1/1992 |
| JP | 4-218916 | 8/1992 |
| JP | 9-129562 | 5/1997 |
| JP | 10-012559 | 1/1998 |
| JP | 2001-102306 | 4/2001 |
| JP | 2004-022833 | 1/2004 |
| JP | 2005-175441 | 6/2005 |
| JP | 2005-268755 | 9/2005 |
| JP | 2005-277386 | 10/2005 |
| JP | 2005-311301 | 11/2005 |
| KR | 10-2001-028032 | 4/2001 |
| KR | 10-0237822 | 1/2002 |
| KR | 10-2006-00838831 | 7/2006 |

OTHER PUBLICATIONS

Japanese Office Action issued on Sep. 20, 2011 for Application No. 2006-257125 with English translation.

Korean Office Action issued on Jul. 21, 2011 for Application No. 10-2007-0096489 with English translation.

* cited by examiner

DIRECT OXIDATION METHOD FOR SEMICONDUCTOR PROCESS

CROSS REFERENCE TO RELATED APPLICATION

This application is a division of Ser. No. 11/902,180, filed Sep. 19, 2007, which is being incorporated in its entirety herein by reference.

BACKGROUND OF THE INVENTION

1. Field of the Invention

The present invention relates to an oxidation apparatus and method for a semiconductor process for oxidizing the surface of a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor integrated circuits, a semiconductor substrate, such as a silicon wafer, is subjected to various processes, such as film formation, etching, oxidation, diffusion, and reformation, in general. For example, oxidation includes oxidation of the surface of a mono-crystalline silicon film or a poly-crystalline silicon film, and oxidation of a metal film. Particularly, a silicon oxide film formed by oxidation is applied to a device isolation film, gate oxide film, capacitor insulating film, or the like.

As regards methods for performing an oxidation process, where looking at them by the type of pressure, there is a normal-pressure oxidation method, in which the atmosphere inside a process container is set to be almost equal to atmospheric pressure. Further, there is a low-pressure oxidation method, in which the atmosphere inside a process container is set to be a vacuum. Where looking at them by the type of gas used for oxidation, there is a wet oxidation method, in which, for example, hydrogen and oxygen are burnt in an external combustion apparatus to generate water vapor, so as to perform oxidation by use of the water vapor (for example, Jpn. Pat. Appln. KOKAI Publication No. 3-140453 (Patent Document 1)). Further, there is a dry oxidation method, in which ozone or oxygen is solely supplied into a process container to perform oxidation without using water vapor (for example, Jpn. Pat. Appln. KOKAI Publication No. 57-1232 (Patent Document 2)).

As described above, oxidation can be performed by dry oxidation that employs oxygen gas, or wet oxidation that employs water vapor. In general, an oxide film formed by wet oxidation is higher in film quality than an oxide film formed by dry oxidation. Accordingly, in consideration of film properties, such as breakdown voltage, corrosion resistance, and reliability, a wet oxide film is better as an insulating film. On the other hand, the film formation rate of an oxide film (insulating film) to be formed and the planar uniformity thereof on a wafer are also important factors. In this respect, a film formed by wet oxidation under a normal pressure shows a high oxidation rate, but shows poor planar uniformity of film thickness, in general. By contrast, a film formed by wet oxidation under a vacuum pressure shows a low oxidation rate, but shows good planar uniformity of film thickness.

Where the design rule of semiconductor devices or semiconductor integrated circuits is not so strict, various oxidation methods as those described above are selectively used, in consideration of, e.g., the intended purpose of oxide films, process conditions, and apparatus cost. On the other hand, in recent years, the line width and film thickness of semiconductor devices have decreased, and thus the design rule has become stricter. This tendency has given rise to demands on better planar uniformity of the quality and thickness of oxide films. However, conventional oxidation methods are now becoming inadequate as regards, because they cannot sufficiently fulfill the demands.

Under the circumstances, there has been proposed an oxidation apparatus, in which $H_2$ gas and $O_2$ gas are independently supplied into a process container and are caused to react with each other inside the process container to generate water vapor, thereby oxidizing a wafer surface (for example, Jpn. Pat. Appln. KOKAI Publication No. 4-18727, Jpn. Pat. Appln. KOKAI Publication No. 2004-22833, Jpn. Pat. Appln. KOKAI Publication No. 2005-277386, and Jpn. Pat. Appln. KOKAI Publication No. 2005-175441 (Patent Documents 3, 4, 5, and 6)).

In the case of techniques disclosed in Patent Documents 3, 5, and 6, where an oxide film is formed, $H_2$ gas and $O_2$ gas are caused to react with each other under a low pressure of about 1 Torr and a relatively low temperature of, e.g., lower than 900° C. to generate oxygen radicals and hydroxyl group radicals. These radicals are used to oxidize a wafer surface, so as to form, e.g., a silicon oxide film.

BRIEF SUMMARY OF THE INVENTION

An object of the present invention is to provide an oxidation apparatus and method for a semiconductor process, which can simplify and speed up an adjustment operation for obtaining optimized process conditions, such as the flow rate of a deoxidizing gas.

According to a first aspect of the present invention, there is provided an oxidation apparatus for a semiconductor process, the apparatus comprising: a process container having a process field configured to accommodate a plurality of target substrates at intervals in a vertical direction, a heater configured to heat the process field; an exhaust system configured to exhaust gas from inside the process field; an oxidizing gas supply circuit configured to supply an oxidizing gas to the process field; and a deoxidizing gas supply circuit configured to supply a deoxidizing gas to the process field, wherein the oxidizing gas supply circuit comprises an oxidizing gas nozzle extending over a vertical length corresponding to the process field, and having a plurality of gas spouting holes arrayed over the vertical length corresponding to the process field, and the deoxidizing gas supply circuit comprises a plurality of deoxidizing gas nozzles having different heights respectively corresponding to a plurality of zones of the process field arrayed vertically, and each having a gas spouting hole formed at height of a corresponding zone.

According to a second aspect of the present invention, there is provided an oxidation method for a semiconductor process, the method comprising: placing a plurality of target substrates at intervals in a vertical direction within a process field of a process container; respectively supplying an oxidizing gas and a deoxidizing gas to the process field, while heating the process field; causing the oxidizing gas and the deoxidizing gas to react with each other, thereby generating oxygen radicals and hydroxyl group radicals within the process field; and performing an oxidation process on a surface of the target substrates by use of the oxygen radicals and the hydroxyl group radicals, wherein the oxidizing gas is supplied from an oxidizing gas nozzle extending over a vertical length corresponding to the process field, and having a plurality of gas spouting holes arrayed over the vertical length corresponding to the process field, and the deoxidizing gas is supplied from a plurality of deoxidizing gas nozzles having different heights respectively corresponding to a plurality of zones of the process field arrayed vertically, and each having a gas spouting hole formed at height of a corresponding zone.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

In the process of developing the present invention, the inventors studied problems of conventional techniques for semiconductor processes, in relation to a method for forming an oxide film by oxidation. As a result, the inventors have arrived at the findings given below.

Figure 9:
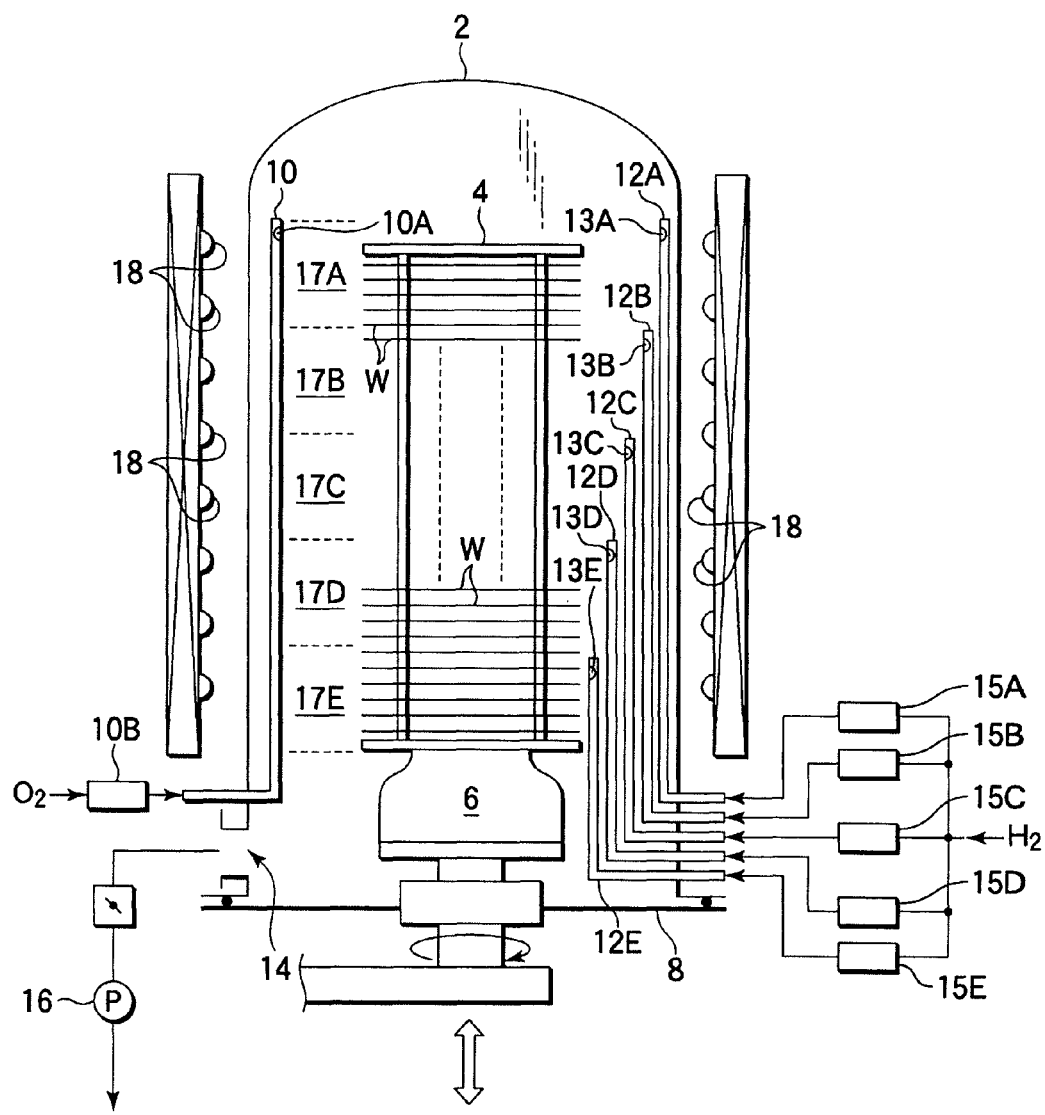
FIG. 9 is a view schematically showing a conventional vertical heat processing apparatus (oxidation apparatus)

FIG. 9 is a view schematically showing a conventional vertical heat processing apparatus (oxidation apparatus). The oxidation apparatus includes a process container 2 formed of a quartz cylinder with a ceiling, in which a wafer boat 4 made of quartz is accommodated. The wafer boat 4 can support a plurality of, such as about 25 to 150, semiconductor wafers W at predetermined intervals in the vertical direction. The wafer boat 4 is supported on a heat-insulating cylinder 6, and is moved up and down by a boat elevator (not shown), so that the wafer boat 4 is loaded and unloaded into and from the process container 2 from and to a lower side. The bottom port of the process container 2 is airtightly closed by a lid 8, which is moved up and down by the boat elevator.

A gas nozzle 10 for supplying oxygen gas and a plurality gas nozzles 12A to 12E for supplying hydrogen gas are connected to a lower side of the process container 2. An exhaust port 14 is formed at a lower side of the process container 2 to vacuum-exhaust the inner atmosphere of the process container 2 by a vacuum pump 16. The oxygen gas nozzle 10 has an L-shape and extends inside the container so that the distal end reaches near the top. The nozzle 10 has a gas spouting hole 10A formed at the distal end, from which oxygen is supplied into the process container 2 on an upstream side of the gas flow, at a flow rate controlled by a mass flow controller 10B.

The hydrogen gas nozzles 12A to 12E respectively have L-shapes with different lengths to correspond to different zones arrayed in the vertical direction inside the process container 2. The nozzles 12A to 12E respectively have gas spouting holes 13A to 13E formed at the distal end.

The hydrogen gas nozzles 12A to 12E are configured to supply hydrogen at flow rates controlled by respective mass flow controllers 15A to 15E. Specifically, the process field inside the process container 2 is divided into five zones 17A to 17E, into which $H_2$ gas can be supplied at gas flow rates optimized respectively for the zones 17A to 17E. A cylindrical heater 18 is disposed around the process container 2 to heat the wafers W to a predetermined temperature.

$H_2$ gas and $O_2$ gas supplied into the process container 2 are burnt at a low pressure of about 1 Torr. Consequently, oxygen radicals and hydroxyl group radicals are generated and oxidize the wafer surface. The hydrogen gas nozzles 12A to 12E arrayed along the zones can respectively replenish $H_2$ gas, which tends to become insufficient on a downstream side of the gas flow due to consumption on the wafer surface.

In an oxidation method for oxidizing a wafer surface by causing $H_2$ gas and $O_2$ gas to react with each other under a low pressure, various activated species (radicals) generated by reactions have very high reactivity. In this case, oxidation proceeds without reference to the orientation of crystal planes exposed on the wafer surface, i.e., without dependency on the orientation of crystal planes. Consequently, even where ragged patterns are present on the wafer surface, an oxide film is formed with a uniform film thickness along the surface of ragged patterns. Further, since radicals are very reactive, a film difficult to oxidize, i.e., an oxidation resistant film, such as a silicon nitride film, can be oxidized.

However, in spite of the advantages described above, the consumption of radicals significantly fluctuates depending on the pattern surface area and/or film type on a wafer surface to be oxidized. Accordingly, process conditions, such as gas flow rates, need to be optimized to compensate for the fluctuation. In this case, it is necessary to obtain optimized process conditions, such as gas flow rates, in advance in accordance the pattern surface area and/or film type. However, obtaining optimized process conditions, such as gas flow rates, requires adjustment operations that are very troublesome.

Figure 10:
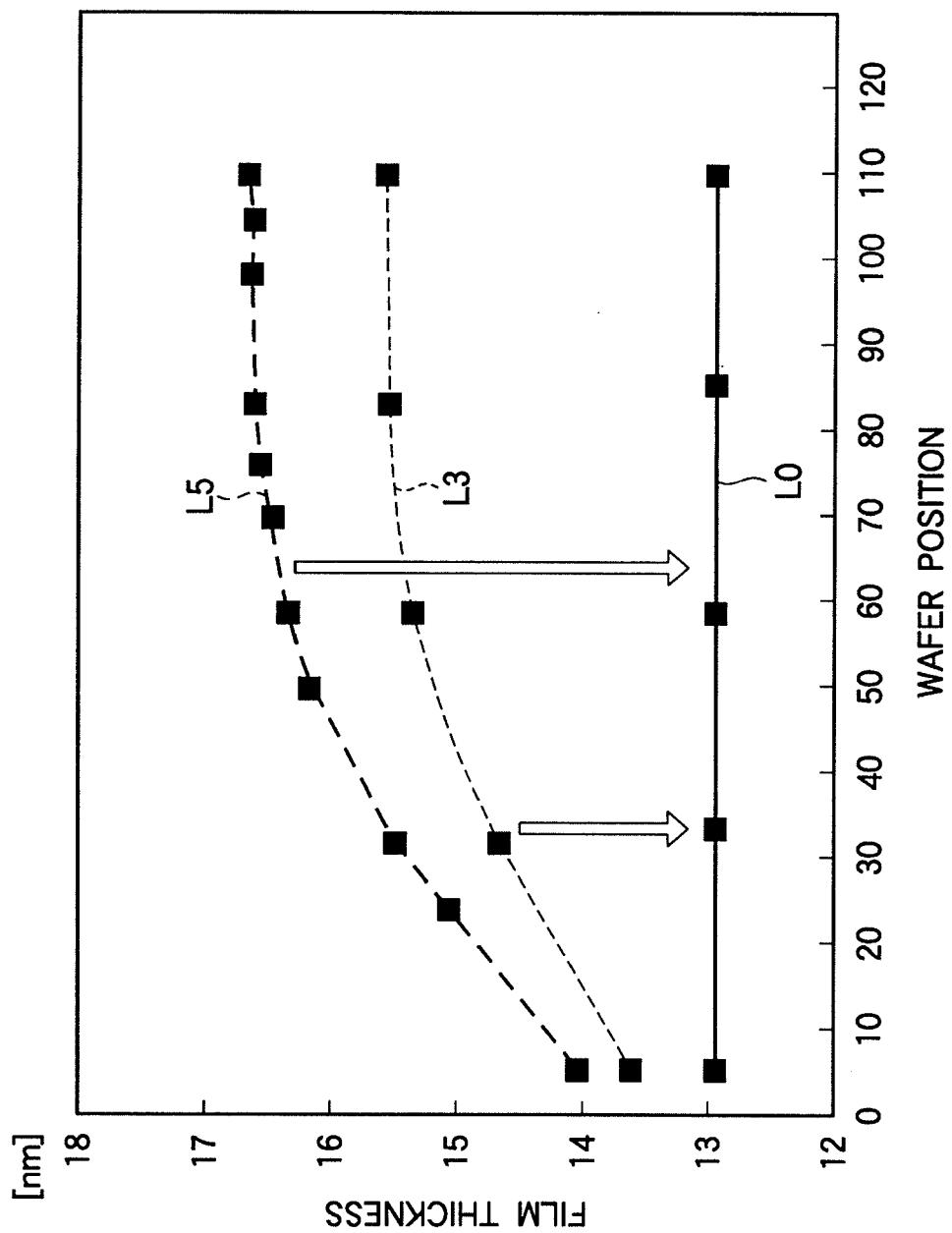
FIG. 10 is a graph for explaining the relationship in principle between the wafer position in a process container and optimized states of the film thickness of a silicon oxide film, obtained by the oxidation apparatus shown in FIG. 9.

FIG. 10 is a graph for explaining the relationship in principle between the wafer position in a process container and optimized states of the film thickness of a silicon oxide film, obtained by the oxidation apparatus shown in FIG. 9. In FIG. 10, the horizontal axis denotes the wafer position numbered in descending order of position from the upstream side of the gas flow to the downstream side. In this embodiment, a higher wafer position in the process container 2 has a smaller number. In FIG. 10, a characteristic line L0 denotes a target film thickness, which is set at 13 nm in this example. The $H_2$ gas flow rates of the nozzles are respectively adjusted to form an oxide film with a thickness of 13 nm on all the wafers in the vertical direction. On the other hand, the $O_2$ gas flow rate is fixed.

In order to improve the inter-substrate uniformity of the film thickness of a silicon oxide film as described above, the following method may be adopted. Specifically, monitor wafers consisting of bare wafers (silicon is exposed without an $SiO_2$ film formed on the surface) for measuring the film thickness are placed between a plurality of dummy wafers with an $SiO_2$ film formed on the surface, which are used to resemble product wafers. Then, the thickness of an $SiO_2$ film formed on the surface of the monitor wafers by oxidation is measured, and the measurement values are plotted to form characteristic lines L3 and L5, as shown in FIG. 10. $H_2$ gas flow rates obtained in this operation are determined as optimum values. The characteristic lines L3 and L5 are shaped as show in FIG. 10, because of the following reason.

Specifically, where an $SiO_2$ film is actually formed while the characteristic line L0 is used as a target film thickness, the film thickness tend to be smaller toward the downstream side due to consumption of the process gases. Accordingly, for example, where an $SiO_2$ film is formed while the $H_2$ gas flow rates of the nozzles 12A to 12E are set the same, a predicted characteristic line therefrom is a lined curved downward that indicates an decrease in film thickness with an increase in the number of the wafer position in FIG. 10. Further, this decrease in film thickness on the downstream side (with an increase in the number of the wafer position) becomes prominent as the surface area of wafers is larger. Accordingly, each of the characteristic lines L3 and L5, which are used for obtaining gas flow rates optimized for product wafers having a larger surface area (due to projected and recessed portions formed on the surface), is formed as a line curved upward to be essentially line-symmetric with the predicted characteristic line curved downward described above, relative to the characteristic line L0, thereby compensating for consumption of the process gases.

The characteristic line L3 is a characteristic line used for an oxidation process applied to wafers each having a surface area increased to be three times larger (triple) by projected and recessed portions formed on the surface, as compared with a wafer having a flat surface. The characteristic line L5 is a characteristic line used for an oxidation process applied to wafers each having a surface area increased to be five times larger (quintuple) by projected and recessed portions formed on the surface. Specifically, for example, where an oxidation process is performed on product wafers each having a surface area increased to be three times larger by projected and recessed portions formed on the surface, as compared with a wafer having a flat surface, $H_2$ gas is supplied from the gas nozzles 12A to 12E at flow rates obtained in formation of the characteristic line L3.

When each of the characteristic lines L3 and L5 is formed, the flow rates of the $H_2$ gas nozzles 12A to 12E are respectively adjusted while the flow rate of $O_2$ gas is fixed at a certain value, as described above. Then, the gas flow rates are adjusted by repeating a trial-and-error operation, so as to attain the target film thickness indicated by the characteristic line L0 when an oxidation process is actually performed on product wafers each having a surface area correspondingly multiplied. Such a trial-and-error operation is preformed for each of wafer sets having different surface areas multiplied by different integer numbers. For example, the characteristic lines L3 and L5 are shifted each other in the vertical direction as a whole by that much corresponding to the film thickness difference. In each of the lines L3 and L5, the thickness is gradually increased from the upstream side to the middle of the gas flow, and then becomes almost constant.

FIG. 10 shows only the characteristic lines L3 and L5 corresponding to two types of the surface area. In practice, however, such a characteristic line is required for each of several wafer sets having different surface areas multiplied by finely classified integer numbers, to obtained $H_2$ gas flow rates for adjustment for each case. Accordingly, it is very difficult and troublesome to obtain optimized process conditions, such as the gas flow rates.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
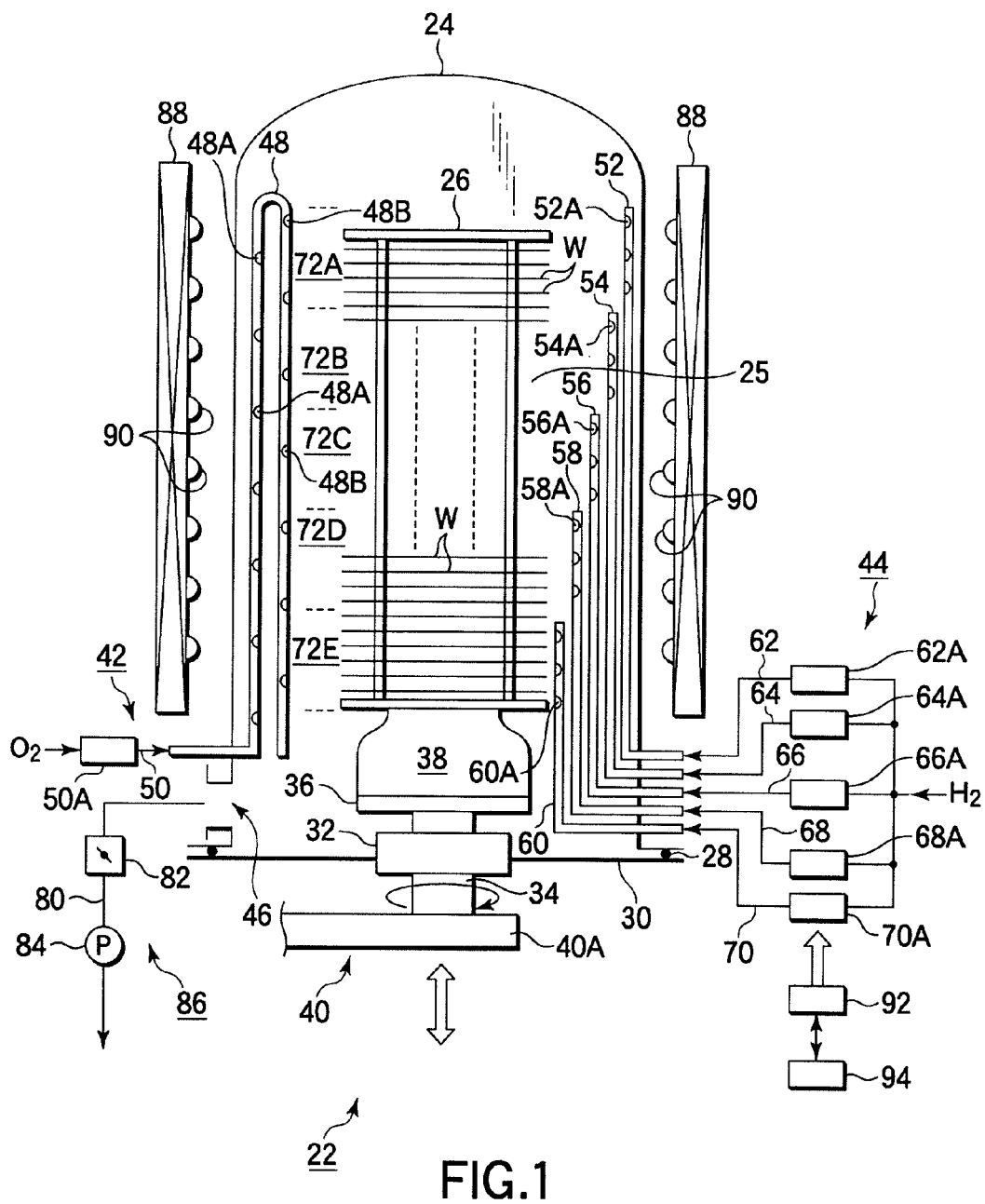
FIG. 1 is a sectional view showing a vertical heat processing apparatus (oxidation apparatus) according to an embodiment of the present invention.

FIG. 1 is a sectional view showing a vertical heat processing apparatus (oxidation apparatus) according to an embodiment of the present invention. The oxidation apparatus 22 has a process field configured to be selectively supplied with an oxidizing gas, such as $O_2$ gas, a deoxidizing gas, such as $H_2$ gas, and an inactive gas, such as $N_2$ gas. The oxidation apparatus 22 is configured to oxidize the surface of target substrates, such as semiconductor wafers, in the process field.

The oxidation apparatus 22 includes a vertical process container 24 formed of a quartz cylinder with a ceiling. The process container 24 has a predetermined length to define therein a process field 25 for accommodating and processing a plurality of semiconductor wafers (target substrates) stacked at predetermined intervals in the vertical direction. In the process field 25, a wafer boat 26 made of quartz is placed to support target substrates or semiconductor wafers W at predetermined intervals in the vertical direction. The intervals may be regular or irregular depending on the wafer position.

The process container 24 has a bottom port provided with a seal member 28, such as an O-ring, and configured to be airtightly closed or opened by a lid 30. A rotary shaft 34 penetrates the lid 30 with a magnetic-fluid seal 32 interposed therebetween. The rotary shaft 34 is connected to a rotary table 36 at the top, on which the wafer boat 26 is mounted through a heat-insulating cylinder 38. The rotary shaft 34 is attached to an arm 40A of a boat elevator 40 movable in the vertical direction, so that the rotary shaft 34 is moved up and down along with the lid 30 and wafer boat 26.

The wafer boat 26 is loaded and unloaded into and from the process container 24 from and to a lower side. The wafer boat 26 may be fixed without being rotatable. A cylindrical manifold made of, e.g., stainless steel may be disposed at the bottom of the process container 24. The sidewall of the process container 24 is connected near the bottom to an oxidizing gas supply circuit 42 and a deoxidizing gas supply circuit 44 respectively for supplying an oxidizing gas and a deoxidizing gas at controlled flow rates to the process field 25. Further, an exhaust port 46 having a large diameter is formed in the sidewall of the process container 24 near the bottom to exhaust the atmosphere of the process field 25.

Specifically, the oxidizing gas supply circuit 42 includes an oxidizing gas nozzle 48 that penetrates the container sidewall. The nozzle 48 is connected to a gas supply passage 50 provided with a flow rate controller 50A, such as a mass flow controller, so that an oxidizing gas, such as oxygen, can be supplied at a controlled flow rate.

The oxidizing gas nozzle 48 comprising a first nozzle portion extending from the bottom (one end) of the process container 24 to the top (the other end), and a second nozzle portion extending from the top to the bottom, such that the first and second nozzle portions are connected through a bent portion. In other words, the oxidizing gas nozzle 48 has a U-shape extending in the vertical direction inside the process container 24. The oxidizing gas nozzle 48 has a plurality of gas spouting holes 48A and 48B for spouting $O_2$ gas, which are formed at predetermined intervals over the entire length and have a diameter of, e.g., about 0.1 to 0.4 mm (the gas spouting holes 48A and 48B may have the same opening surface area). The intervals of the gas spouting holes 48A and 48B are set to be, e.g., about 8 to 200 mm (the intervals may be regular).

Each of the gas spouting holes 48B formed on the second nozzle portion (downstream from the bent portion) of the oxidizing gas nozzle 48 is located at the center between two adjacent gas spouting holes 48A formed on the first nozzle portion (upstream from the bent portion). Consequently, $O_2$ gas is supplied from positions distributed most in the vertical direction inside the process container 24. Further, a gas spouting holes 48A on a more upstream side is combined in position with a gas spouting holes 48B on a more downstream side, so $O_2$ gas is spouted at an almost uniform flow rate toward all the wafers W inside the process container 24. This is so, because $O_2$ gas has higher pressure and is spouted more at a gas spouting hole positioned on a more upstream side of the oxidizing gas nozzle 48.

The deoxidizing gas supply circuit 44 includes a plurality of, such as five, deoxidizing gas nozzles 52, 54, 56, 58, and 60 that penetrate the container sidewall. The nozzles 52 to 60 respectively connected to gas supply passages 62, 64, 66, 68, and 70 respectively provided with flow rate controllers 62A, 64A, 66A, 68A, 70A, such as mass flow controllers, so that a deoxidizing gas, such as hydrogen, can be supplied at respectively controlled flow rates.

The process field 25 inside the process container 24 is divided into a plurality of, such as five, zones 72A, 72B, 72C, 72D, and 72E, arrayed in the vertical direction, to correspond to the number of deoxidizing gas nozzles 52 to 60. In other words, the process field 25 is formed of five zones 72A to 72E arrayed from the upstream side of the gas flow to the downstream side. The five deoxidizing gas nozzles 52 to 60 have different lengths to correspond to the five zones 72A to 72E.

The deoxidizing gas nozzles 52 to 60 respectively have sets of gas spouting holes 52A, 54A, 56A, 58A, and 60A formed at the distal end to spout $H_2$ gas toward respective zones 72A to 72E. The deoxidizing gas nozzles 52 to 60 respectively have sets of three gas spouting holes 52A to 60A formed at predetermined intervals. However, the number of gas spouting holes is not limited to three. The gas spouting holes 52A to 60A have a diameter of, e.g., about 0.1 to 0.4 mm (the gas spouting holes 52A to 60A may have the same opening surface area). The intervals of the gas spouting holes 52A to 60A are set to be, e.g., about 8 to 200 mm (the intervals may be regular).

On the other hand, the exhaust port 46 formed in the sidewall of the process container 24 near the bottom is connected to a vacuum exhaust system 86 including an exhaust passage 80 provided with a pressure control valve 82 and a vacuum pump 84 to vacuum-exhaust the inner atmosphere of the process container 24. The process container 24 is surrounded by a cylindrical heat-insulating layer 88, in which a heater 90 is disposed to heat the wafers W positioned inside to a predetermined temperature.

As regards the entire size of the process container 24, for example, where 100 wafers W of 8-inch (product wafers) are processed together, the process container 24 has a height of about 1,300 mm. Where 25 to 50 wafers W of 12-inch are processed together, the process container 24 has a height of about 1,500 mm.

The oxidation apparatus 22 includes a control section 92 comprising, e.g., a micro-processor configured to control the flow rate controllers 50A and 62A to 70A, pressure control valve 82, and heater 90, so as to generate oxygen radicals and hydroxyl group radicals by a reaction of the two gases. Further, the control section 92 is used for controlling the operation of the entire oxidation apparatus 22, so it transmits instructions to control the oxidation apparatus 22. The control section 92 includes a storage medium or media 94, such as a floppy disk, a flash memory, and/or a hard disk, which store programs for performing control operations. The oxidation apparatus 22 further includes an inactive gas supply mechanism (not shown) for supplying an inactive gas, such as $N_2$ gas, as needed.

Next, an explanation will be given of an oxidation method performed in the oxidation apparatus 22 having the structure described above.

When the oxidation apparatus 22 is set in standby with no semiconductor wafers W loaded therein, the process container 24 is maintained at a temperature lower than the process temperature. When the process is started, at first, the wafer boat 26 at room temperature, which supports a number of, such as 100, wafers is loaded from below into the process field 25 (of the process container 24 in a hot wall state) heated to a predetermined temperature. The bottom port of the process container 24 is closed by the lid 30 to airtightly seal the process container 24.

Then, the process field 25 is vacuum-exhausted and kept at a predetermined process pressure. Further, the process field 25 is heated and kept at a process temperature for the oxidation process by increasing the power applied to the heater 90. Thereafter, the predetermined process gases necessary for the oxidation process, i.e., $O_2$ gas and $H_2$ gas, are respectively supplied to the process field 25 at controlled flow rates through the oxidizing gas nozzle 48 and deoxidizing gas nozzles 52 to 60 of the gas supply circuits 42 and 44.

$O_2$ gas is spouted in horizontal directions from the gas spouting holes 48A and 48B of the oxidizing gas nozzle 48 having a U-shape. $H_2$ gas is supplied in horizontal directions from the gas spouting holes 52A to 60A of the deoxidizing gas nozzles 52 to 60 at controlled flow rates for the respective zones 72A to 72E.

These gases flow downward inside the process field 25 from the upper side to the lower side, and react with each other under a vacuum atmosphere to generate hydroxyl group radicals and oxygen radicals. The atmosphere thus formed comes into contact with the wafers W supported on the wafer boat 26, which is being rotated, thereby performing the oxidation process on the wafer surface. Consequently, the surface made of, e.g., silicon is oxidized and an oxide film made of, e.g., $SiO_2$ is formed. The gas inside the process field 25 (the process gases and reaction product gases) is exhausted outside by the vacuum exhaust system 86 from the exhaust port 46 formed in the sidewall of the process container 24 near the bottom. The gas flow rates used at this time depend on the size of the process container 24. For example, where the process container 24 has a size to accommodate about 100 wafers of 8-inch, $O_2$ gas is set to be within a range of 10 to 30,000 sccm, and $H_2$ gas is set to be within a range of 1 to 5,000 sccm.

$O_2$ gas and $H_2$ gas are respectively supplied into the process container 24 and flow downward inside the process field 25 of the process container 24 in a hot wall state. At this time, these gases generate an atmosphere mainly comprising oxygen radicals (O*) and hydroxyl group radicals (OH*) by a hydrogen combustion reaction in the vicinity of the wafers W. With the radicals, the silicon surface of the wafers W is oxidized, and an $SiO_2$ film is thereby formed.

The process conditions used at this time include a wafer temperature of 450 to 1,100° C., such as 900° C., a pressure of 466 Pa (3.5 Torr) or less, and preferably of 1 Torr or less, such as 46.6 Pa (0.35 Torr). The process time is set to be, e.g., about 10 to 30 minutes, although it depends on the thickness of a film to be formed. If the process temperature is lower than 450° C., the activated species (radicals) described above cannot be sufficiently generated. If the process temperature is higher than 1,100° C., it exceeds the heat-resistant temperature of the process container 24 and/or wafer boat 26, and jeopardizes the safety of the process. If the process pressure is higher than 3.5 Torr, the radicals described above cannot be sufficiently generated.

As described previously, there may be a case where each product wafer actually processed has a surface area increased to be several times larger by projected and recessed portions formed on the surface, as compared with a wafer having a flat surface. Since consumption of radicals greatly varies, depending on the multiplication of the surface area, it is necessary to optimize process conditions, such as the flow rate of a gas to be supplied, in accordance with variation in wafer surface area, before an oxidation process is performed on product wafers. According to the conventional oxidation apparatus, as described with reference to FIG. 10, characteristic lines of the film thickness are curved, as shown by the characteristic line L3 for the triple surface area and the characteristic line L5 for a quintuple surface area. In this case, an adjustment operation for obtaining gas flow rates needs to be performed in a trial-and-error manner, and thus is very troublesome.

On the other hand, in this embodiment, the oxidizing gas nozzle 48 extends in the longitudinal direction, i.e., along the process field 25 inside the process container 24, and is provided with gas spouting holes 48A and 48B formed at predetermined intervals, from which the oxidizing gas or $O_2$ gas is supplied. Consequently, $O_2$ gas is supplied in horizontal directions essentially uniformly to the process field 25 and thus to the wafers W. Further, a plurality of, such as five, deoxidizing gas nozzles 52 to 60 have different lengths or heights and are provided with gas spouting holes 52A to 60A, from which $H_2$ gas is supplied in horizontal directions to the respective zones of the process field 25.

In this case, $O_2$ gas and $H_2$ gas supplied into the process container 24 sequentially replenish the gases, which may become insufficient on a downstream side of the gas flow from the upper side to the lower side, due to consumption on the wafer surface Such a supply system of $O_2$ gas and $H_2$ gas can simplify and speed up an adjustment operation for optimizing the gas flow rates of the deoxidizing gas nozzles 52 to 60 to improve the inter-substrate uniformity of the film thickness on the wafers. The adjustment operation may be performed with reference to the thickness of the $SiO_2$ film formed on monitor wafers for measuring the film thickness, which are placed between a plurality of dummy wafers. The dummy wafers have an $SiO_2$ film formed on the surface in advance and are used to resemble product wafers. In this case, the gas flow rates of the deoxidizing gas nozzles 52 to 60 are respectively adjusted to set the thickness of the $SiO_2$ film on the monitor wafers to be essentially uniform in the vertical direction inside the process container 24, thereby obtaining optimized gas flow rates.

Figure 2:
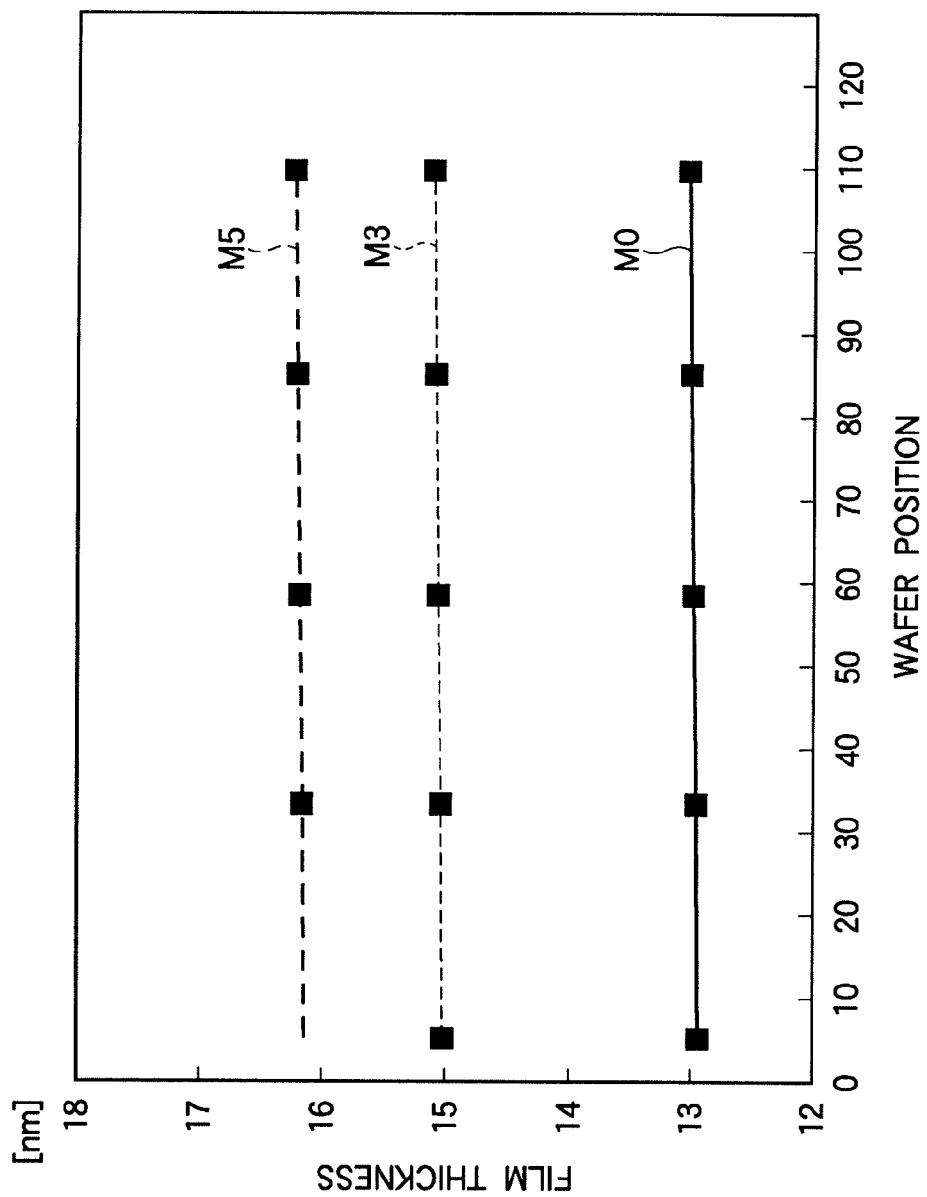
FIG. 2 is a graph for explaining the relationship in principle between the wafer position in a process container and optimized states of the film thickness of a silicon oxide film, obtained by the oxidation apparatus shown in FIG. 1.

FIG. 2 is a graph for explaining the relationship in principle between the wafer position in the process container and optimized states of the film thickness of a silicon oxide film, obtained by the oxidation apparatus shown in FIG. 1. In FIG. 2, the wafer position is numbered in descending order of position along the gas flow, such that the wafer position is given a smaller number on a more upstream side and a larger number on a more downstream side. In FIG. 2, a characteristic line M0 denotes a target film thickness, which is set at 13 nm in this example. The $H_2$ gas flow rates of the nozzles are respectively adjusted to form an oxide film with a thickness of 13 nm on all the wafers in the vertical direction. On the other hand, the $O_2$ gas flow rate is fixed.

As described above, in order to improve the inter-substrate uniformity of the film thickness of a silicon oxide film as described above, the following method may be adopted. Specifically, monitor wafers consisting of bare wafers (silicon is exposed without an $SiO_2$ film formed on the surface) for measuring the film thickness are placed between a plurality of dummy wafers with an $SiO_2$ film formed on the surface, which are used to resemble product wafers. Then, the thickness of an $SiO_2$ film formed on the surface of the monitor wafers by oxidation is measured, and the measurement values are plotted to form characteristic lines M3 and M5, as shown in FIG. 2. $H_2$ gas flow rates obtained in this operation are determined as optimum values.

The characteristic line M3 is a characteristic line used for an oxidation process applied to wafers each having a surface area increased to be three times larger (triple) by projected and recessed portions formed on the surface, as compared with a wafer having a flat surface. The characteristic line M5 is a characteristic line used for an oxidation process applied to wafers each having a surface area increased to be five times larger (quintuple) by projected and recessed portions formed on the surface.

For example, when the characteristic line M5 is formed, the $H_2$ gas flow rates of the deoxidizing gas nozzles 52 to 60 are respectively adjusted while the flow rate of $O_2$ gas is fixed at a certain value, as described above. Then, the gas flow rates are adjusted, so as to attain the target film thickness indicated by the characteristic line M0 when an oxidation process is actually performed on product wafers each having the quintuple surface area.

It should be noted that, according to this embodiment, the characteristic line M5 linearly extends in the horizontal direction in FIG. 2 and thus renders a constant film thickness in the inter-substrate direction, unlike the characteristic lines L3 and L5 shown in FIG. 10. In other words, the $H_2$ gas flow rates of the deoxidizing gas nozzles 52 to 60 are respectively adjusted to set the film thickness on all the monitor wafers at a constant value in the inter-substrate direction. Then, the $H_2$ gas flow rates thus obtained are used for performing an oxidation process on actual product wafers, so that the film thickness of the $SiO_2$ film formed on the product wafers renders good inter-substrate uniformity.

In the case of the conventional apparatus, when the characteristic lines L3 and L5 shown in FIG. 10 are formed, trial-and-error operations are required. Such film thickness curves need to be prepared for respective wafers with different surface areas, but it is very difficult and troublesome to obtain these film thickness curves. On the other hand, according to this embodiment, each of the characteristic lines M3 and M5 linearly extends in the horizontal direction, the following simple adjust operation can be adopted. Specifically, one characteristic line, such as the characteristic line M5, is formed in advance, and then other characteristic lines for differently multiplied surface areas, such as the characteristic line M3, are formed by shifting the former characteristic line in parallel in the vertical direction. In other words, where an oxidation process is performed on product wafers each having a multiplied surface area different from the quintuple surface area, the characteristic line M5 for the quintuple surface area can be utilized as it is while merely the process time of the oxidation process is shortened or prolonged. Consequently, it is possible to simplify and speed up an adjustment operation for obtaining optimized process conditions, such as the flow rates of $H_2$ gas.

As described above, the oxidizing gas nozzle 48 for supplying an oxidizing gas, such as $O_2$, has a plurality of gas spouting holes 48A formed at predetermined intervals over the process field 25. Further, a plurality of deoxidizing gas nozzles 52 to 60 respectively having different lengths are disposed to supply a deoxidizing gas, such as $H_2$, to the different zones of the process field 25 arrayed in the vertical direction. Consequently, film thickness characteristics for different surface area wafers W are formed with good inter-substrate uniformity (i.e., to be linear), which can simplify and speed up an adjustment operation for obtaining optimized process conditions, such as the flow rates of a deoxidizing gas.

The determination of process conditions described above can be generalized in a method according to this embodiment, as follows. Specifically, at first, reference conditions of an oxidation process are obtained for reference substrates each having a reference surface area, while a predetermined level of inter-substrate uniformity is satisfied (preferably to form a linear characteristic, as shown in FIG. 2). The surface area of each of target substrates to be actually processed has a certain ratio relative to the reference surface area. Then, actual conditions of the oxidation process to be used for the target substrates are determined from the reference conditions, while adjusting essentially merely the process time thereof, as a function of the certain ratio. Preferably, the inter-substrate uniformity is determined with reference to the inter-substrate uniformity of the thickness of a film formed by the oxidation process. Further, the reference conditions include the flow rates of an oxidizing gas and a deoxidizing gas.

Experiment 1

Figure 3:
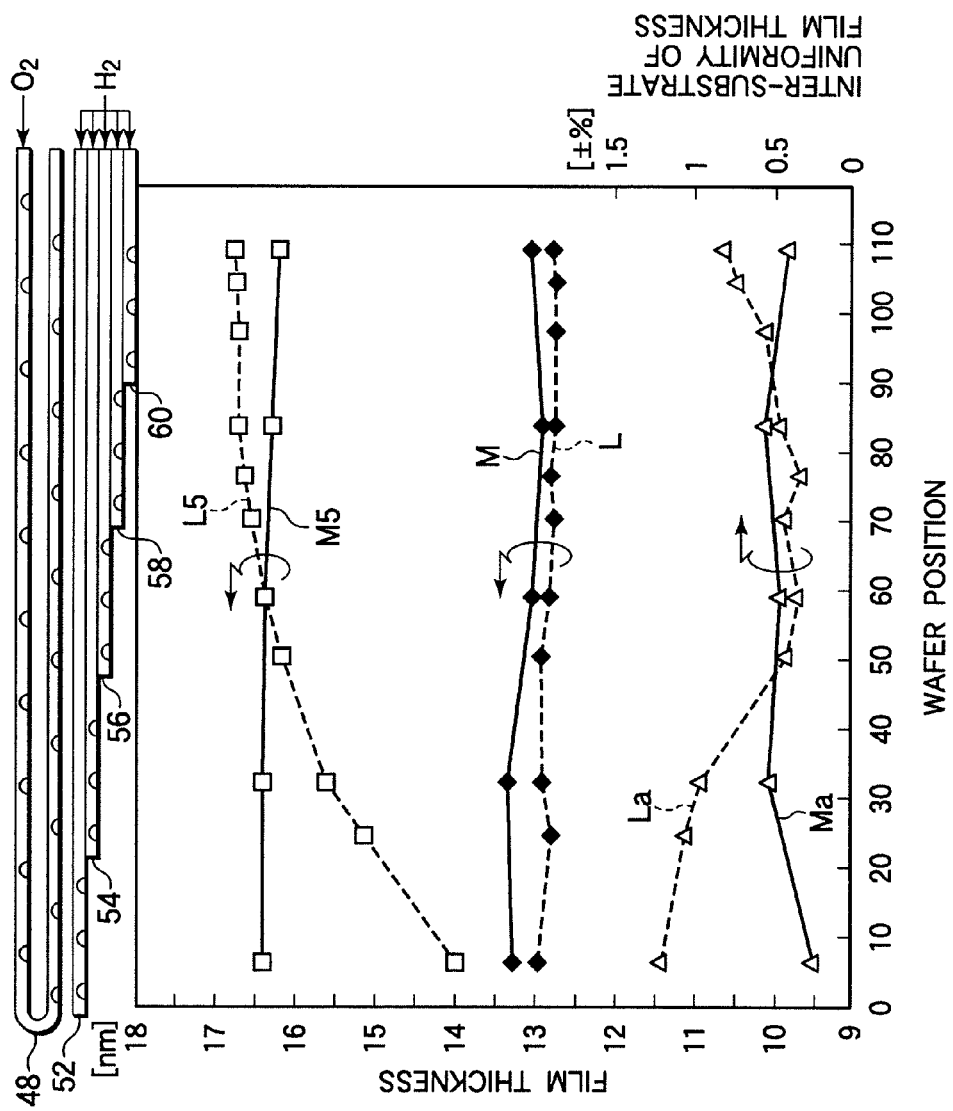
FIG. 3 is a graph showing optimized states of the film thickness of a silicon oxide film, and actual states and planar uniformity of the film thickness of a silicon oxide film formed on product wafers, obtained by the oxidation apparatus shown in FIG. 1 and a conventional apparatus.

In the oxidation apparatus shown in FIG. 1 according to the embodiment described above, an oxidation process was performed on actual product wafers by use of $H_2$ gas flow rates obtained by optimizing the thickness of a silicon oxide film. FIG. 3 is a graph showing optimized states of the film thickness of a silicon oxide film, and actual states and planar uniformity of the film thickness of a silicon oxide film formed on product wafers, obtained by the oxidation apparatus shown in FIG. 1 and a conventional apparatus. The measurement values of a silicon oxide film formed by the conventional apparatus are used for comparison. The gas nozzles of the embodiment are schematically shown above this graph.

In FIG. 3, a characteristic line L5 denotes a characteristic line optimized for the quintuple surface area by the conventional apparatus. The characteristic line L denotes a film thickness obtained when the oxidation process was actually performed on product wafers with the quintuple surface area in the conventional apparatus. The characteristic line L5 was obtained under the following process conditions. Specifically, the process pressure was set at 0.35 Torr, the process temperature at 900° C., and the $O_2$ gas flow rate at 5.0 slm. The $H_2$ gas flow rates of the nozzles 12A to 12E shown in FIG. 9 were set at 0.40 slm for the nozzle 12A, at 0.65 slm for the nozzle 12B, 0.45 slm for the nozzle 12C, 0.40 slm for the nozzle 12D, and 0.35 slm for the nozzle 12E. The process time was set at 45 minutes.

A characteristic line M5 denotes a characteristic line optimized for the quintuple surface area by the apparatus shown in FIG. 1. The characteristic line M denotes a film thickness obtained when the oxidation process was actually performed on product wafers with the quintuple surface area in the apparatus shown in FIG. 1. At this time, the target film thickness for the product wafers was set at 13 nm. The characteristic line M5 was obtained under the following process conditions. Specifically, the process pressure was set at 0.35 Torr, the process temperature at 900° C., and the $O_2$ gas flow rate at 5.0 slm. The $H_2$ gas flow rates were set at 0.2 slm for the nozzle 52, at 0.4 slm for the nozzle 54, 0.42 slm for the nozzle 56, 0.45 slm for the nozzle 58, and 0.45 slm for the nozzle 60. The process time was set at 45 minutes.

A characteristic line La denotes the planar uniformity of a film thickness formed on product wafers with the quintuple surface area in the conventional apparatus. A characteristic line Ma denotes the planar uniformity of a film thickness formed on product wafers with the quintuple surface area in the apparatus shown in FIG. 1.

In the characteristic line for the quintuple surface area obtained by the conventional apparatus, i.e., the characteristic line L5, the film thickness was gradually increased from the upstream side to the middle of the gas flow, and then becomes almost constant. In the characteristic line for the quintuple surface area obtained by the apparatus shown in FIG. 1, i.e., the characteristic line M5, the film thickness was essentially constant at about 16.5 nm (i.e., linear).

In accordance with optimized process conditions, such as gas flow rates, obtained by forming the characteristic line L5 and characteristic line M5, an oxidation process was performed on product wafers. As a result, as indicated by the characteristic lines L and M, the film thickness was essentially constant at 13 nm in the inter-substrate direction.

As regards the planar uniformity of the film thickness, the characteristic line La obtained by the conventional apparatus rendered poor planar uniformity of the film thickness, such that the planar uniformity was increased to ±1% at TOP (upstream side) and BTM (downstream side). On the other hand, the characteristic line Ma obtained by the apparatus shown in FIG. 1 rendered better planar uniformity of the film thickness than that of the conventional apparatus, such that the planar uniformity was ±0.5% or less at all the wafer positions.

Figure 4A:
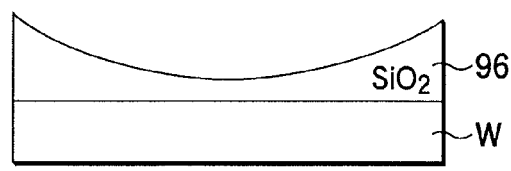
FIGS. 4A and 4B are sectional views for explaining the disposition of the thickness of a thin film formed on the surface of a semiconductor wafer.
Figure 4B:
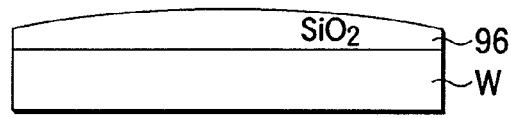

It is thought that the result described above was due to the following phenomenon. Specifically, in general, during an oxidation process performed on a wafer, a gas flows from the periphery of the wafer to the center, while radicals are gradually consumed. Consequently, as indicated by the wafer cross section shown in FIG. 4A, the film thickness of an $SiO_2$ film 96 is larger on the wafer periphery where radicals are rich, while the film thickness is smaller on the wafer center where radicals are poor. In this respect, according to the apparatus shown in FIG. 1, a plurality of gas spouting holes 48A and 52A to 60A are formed on the nozzles 48 and 52 to 60 extending in the longitudinal direction of the process container 24, so that $O_2$ gas and $H_2$ gas are respectively distributed essentially all over the process field 25. In this case, as shown in FIG. 4B, the gases (radicals) do not become insufficient even at the wafer center, which is thus oxidized almost equally to the wafer periphery. Consequently, as shown in FIG. 4B, an $SiO_2$ film 96 is formed with a film thickness slightly larger at the wafer center.

<Modification of Nozzle>

Figures 5A, 5B:
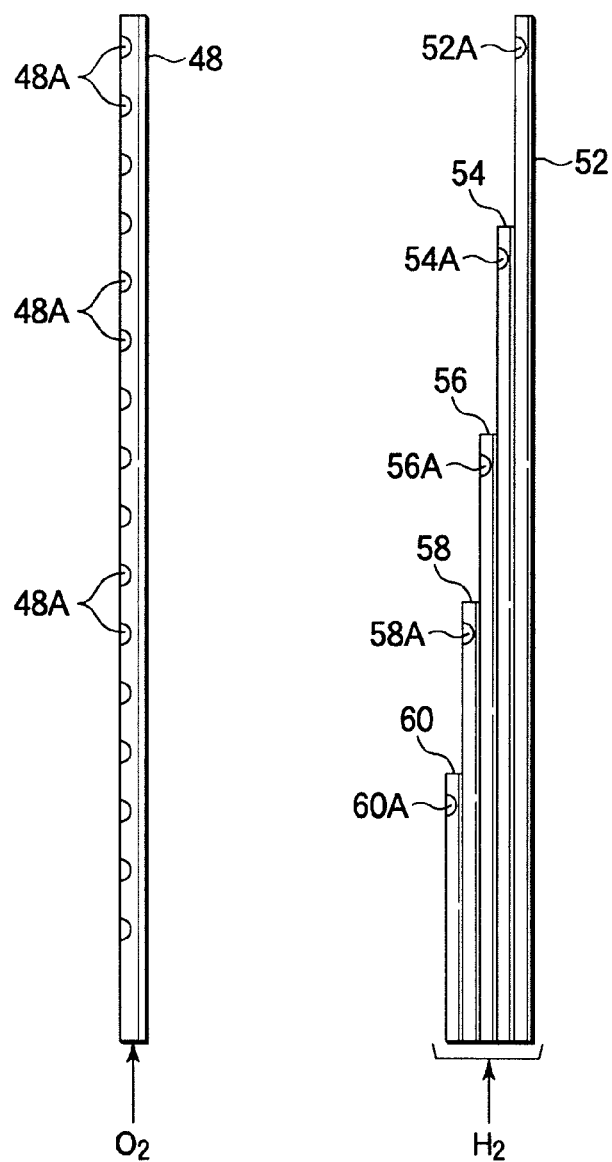
FIGS. 5A and 5B are views showing modifications of nozzles.

FIGS. 5A and 5B are views showing modifications of nozzles. In the embodiment described above, the oxidizing gas nozzle 48 is formed of a U-shaped nozzle having two nozzle portions extending in the vertical direction and connected to each other through a bent portion. Alternatively, as shown in FIG. 5A, the oxidizing gas nozzle 48 may be formed of one linearly extending nozzle having a plurality of gas spouting holes 48A formed at predetermined intervals. The intervals of the gas spouting holes 48A used in this case are smaller that those shown in FIG. 1 and are preferably set at, e.g., about ½ thereof. In this case, although the uniformity of the $O_2$ gas flow rate becomes slightly poorer than that of the case shown in FIG. 1, the same effects as those of the apparatus shown in FIG. 1 can be obtained.

In the embodiment described above, each of the deoxidizing gas nozzles 52 to 60 has a plurality of, such as three, gas spouting holes (52A to 60A) formed at the top. Alternatively, as shown in FIG. 5B, only one gas spouting hole (52A to 60A) may be formed. This nozzle structure is the same as that shown in FIG. 9.

The nozzle 48 shown in FIG. 5A and the nozzles 52 to 60 shown in FIG. 5B may be combined. In any of the combinations of these nozzles, the same effects as those of the apparatus shown in FIG. 1 can be obtained.

<Improvement in Planar Uniformity of Film Thickness>

An oxide film formed on wafers in the oxidation apparatus shown in FIG. 1 was examined in terms of the planar uniformity of film thickness, and found that the planar uniformity could be poor at specific wafer positions. It is thought that this result was due to the fact that, where the gas spouting holes were directed to the wafers, the balance of mixture of $O_2$ and $H_2$ gases was deteriorated at the specific wafer positions. Accordingly, the orientation of the gas spouting holes, i.e., the gas spouting direction, is preferably modified not to spout gas directly to the wafers W.

Figure 6A:
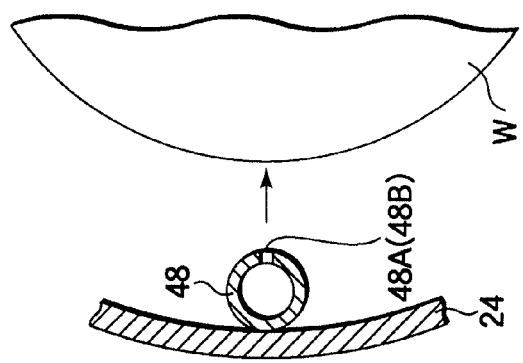
FIG. 6A is a view showing a case where the gas spouting direction of gas spouting holes is directed to the center of a wafer.
Figure 6B:
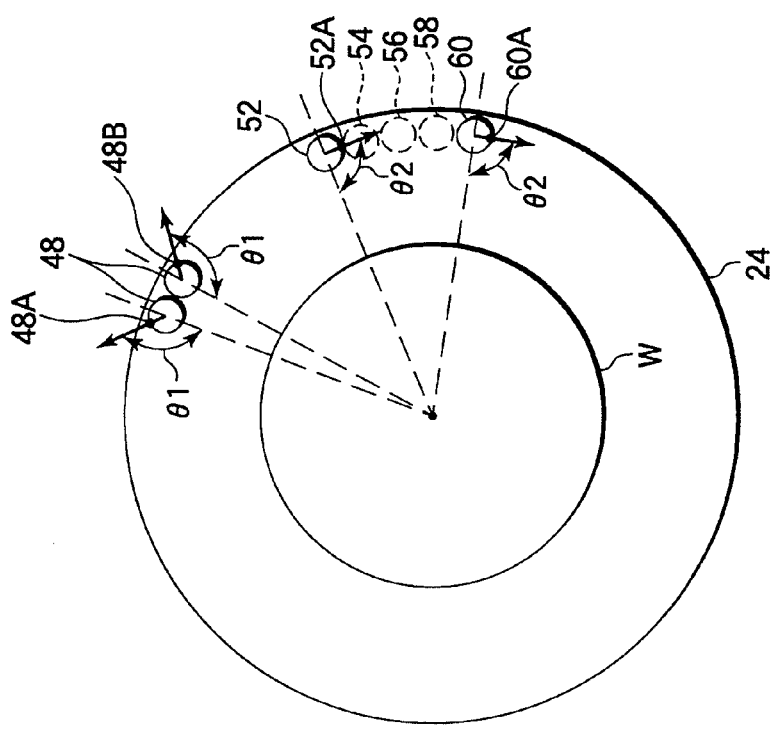
FIG. 6B is a view schematically showing the relationship of an oxidizing gas nozzle and deoxidizing gas nozzles, each of which has gas spouting holes with an improved gas spouting direction, relative to the process container and wafer.
Figure 6C:
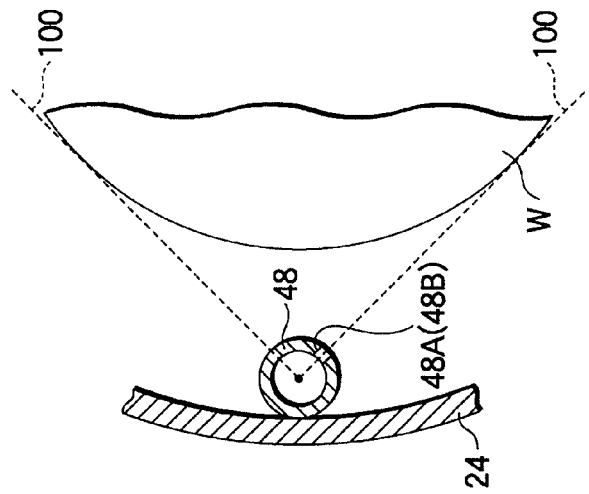
FIG. 6C is a view showing an alternative modification of the gas spouting direction of gas spouting holes.
Figure 7:
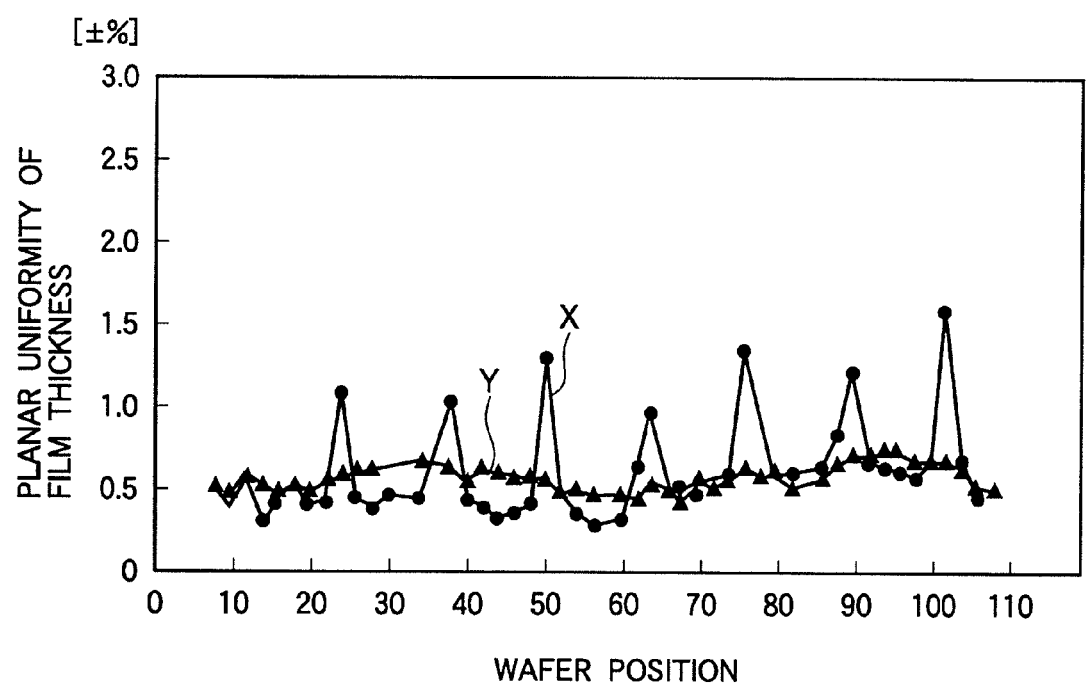
FIG. 7 is a graph showing the planar uniformity of film thickness obtained by the gas spouting holes shown in FIGS. 6A and 6B.

FIG. 6A is a view showing a case where the gas spouting direction of gas spouting holes is directed to the center of a wafer. FIG. 6B is a view schematically showing the relationship of an oxidizing gas nozzle 48 and deoxidizing gas nozzles 52 to 60, each of which has gas spouting holes with an improved gas spouting direction, relative to the process container 41 and wafer W. FIG. 6C is a view showing an alternative modification of the gas spouting direction of gas spouting holes. FIG. 7 is a graph showing the planar uniformity of film thickness obtained by the gas spouting holes shown in FIGS. 6A and 6B.

In the arrangement shown in FIG. 6A, the gas spouting holes 48A and 48B of the oxidizing gas nozzle 48 are directed to the wafers W to spout the gas directly to the wafers W. Where this arrangement was used, the planar uniformity of film thickness became very poor at specific wafer positions, as indicated by a characteristic line X shown in FIG. 7. As described above, this was due to the gas directly coming into contact with the wafer W from a lateral side, whereby the balance of mixture of $O_2$ and $H_2$ gases was deteriorated and the combustion reaction was hindered from properly taking place.

In the arrangement shown in FIG. 6B, the gas spouting holes 48A and 48B of the oxidizing gas nozzle 48 are set to have a gas spouting direction that forms an angle θ1 of 135° relative to a line connecting the center of the gas nozzle and the center of each wafer. Further, the gas spouting holes 48A and 48B of the first and second nozzle portions of the oxidizing gas nozzle 48 are directed to opposite sides. On the other hand, the gas spouting holes 52A to 60A of the deoxidizing gas nozzles 52 to 60 are set to have a gas spouting direction that forms an angle θ2 of 90° relative to a line connecting the center of the gas nozzle and the center of each wafer. Further, the deoxidizing gas nozzles 52 to 60 are arrayed from the upstream side in decreasing order of height. Where this arrangement was used, the planar uniformity of film thickness was greatly improved as indicated by a characteristic line Y shown in FIG. 7, as compared with the characteristic line X.

In this respect, it suffices if the gas spouting direction of the oxidizing gas nozzle 48 and deoxidizing gas nozzles 52 to 60 deviates from at least the contour of the wafers W, as shown in FIG. 6C. However, as shown in FIG. 6B, where the gas spouting direction is set to form an angle of 90° or more relative to a line connecting the center of the gas nozzle and the center of each wafer, the gas first comes into contact with the container sidewall and then diffuses, so that the gas is uniformly distributed onto the wafer surface. In light of these matters, the gas spouting direction of the oxidizing gas nozzle 48 and deoxidizing gas nozzles 52 to 60 is set in a tangential direction to the contour of the wafers or in a direction outside the tangential direction. Further, the gas spouting direction is set to form an angle preferably of 90° or more, and more preferably of 90° to 135°, relative to a line connecting the center of the gas nozzle and the center of each wafer <Examination on Processes With Different Numbers of Wafers>

Where an oxidation process is performed on actual product wafers, the number of product wafers to be processed may be smaller than that in the full load state of a wafer boat. Specifically, the number of wafers to be subjected to an oxidation process does not necessarily reach the full load state of the wafer boat 26, so empty spaces may be partly present in the wafer boat 26. For example, where the wafer boat 26 can hold 100 product wafers in the full load state (the maximum number), this boat 26 may be used to hold 25 or 50 product wafers along with non-product or dummy wafers to fill the empty spaces, wherein the dummy wafers have an $SiO_2$ film formed on the surface. In this case, the product wafers W are held on the wafer boat 26 to fill the most upstream side of the gas flow on the wafer boat 26. Specifically, in the structure shown in FIG. 1, since the gases flow downward inside the process container 24 from the upper side to the lower side, the wafers are inserted in supporting levels in descending order from the top of wafer boat 26.

Experiment 2

Figure 8A:
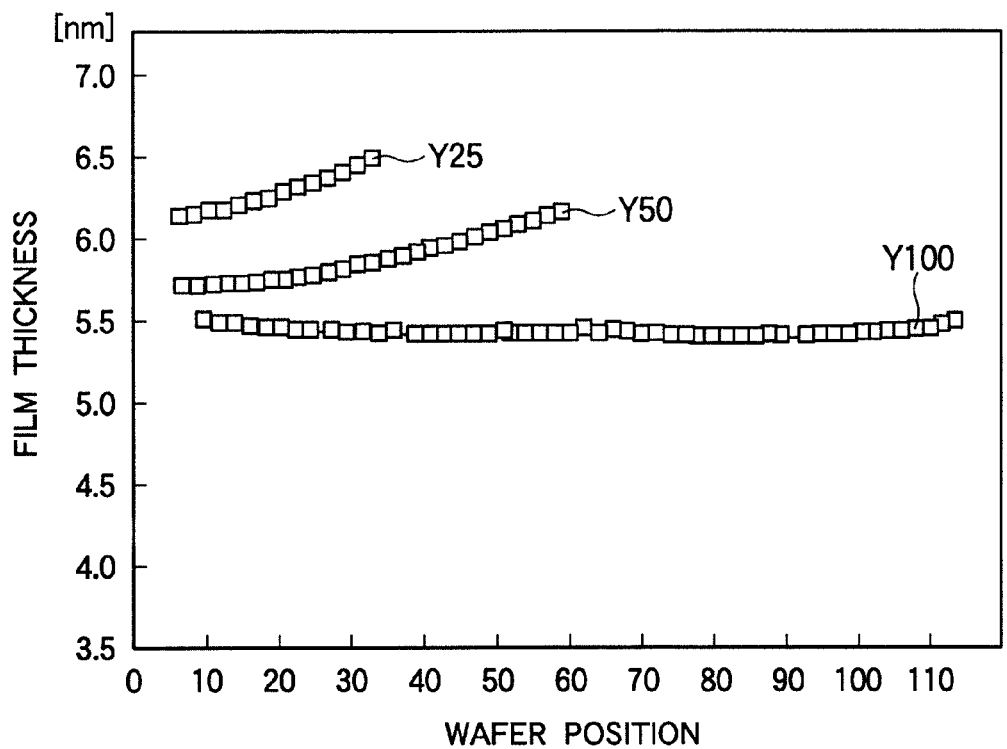
FIGS. 8A and 8B are graphs each showing a change in the film thickness of an oxide film obtained when an oxidation process was performed on product wafers, the number of which was smaller than that in the full load state of a wafer boat.
Figure 8B:
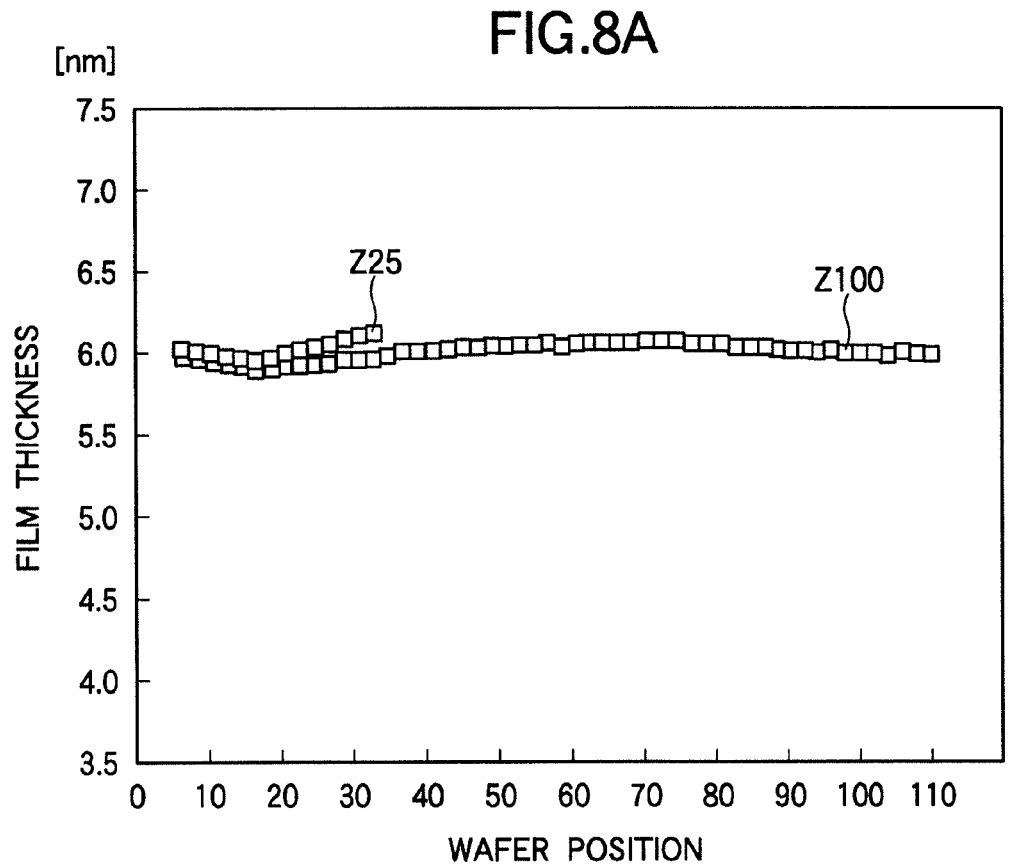

An experiment was conducted to perform an oxidation process on product wafers, the number of which was smaller than that in the full load state of a wafer boat. FIGS. 8A and 8B are graphs each showing a change in the film thickness of an oxide film obtained when an oxidation process was performed on product wafers, the number of which was smaller than that in the full load state of a wafer boat. FIG. 8A shows the results of oxidation processes performed in the conventional apparatus shown in FIG. 9. FIG. 8B shows the results of oxidation processes performed in the apparatus shown in FIG. 1. In the case shown in FIG. 8A, the target film thickness was set at 5.5 nm. In the case shown in FIG. 8B, the target film thickness was set at 6.0 nm.

In FIG. 8A, a characteristic line Y100 denotes a characteristic obtained when 100 product wafers were loaded (full load). A characteristic line Y50 denotes a characteristic obtained when 50 product wafers were loaded (non-full load). A characteristic line Y25 denotes a characteristic obtained when 25 product wafers were loaded (non-full load). For the oxidation processes performed to obtain the characteristic lines Y100, Y50, and Y25, the flow rates of $H_2$ and $O_2$ gases, process pressure, and process temperature were set the same.

In FIG. 8B, a characteristic line Z100 denotes a characteristic obtained when 100 product wafers were loaded (full load). A characteristic line Z25 denotes a characteristic obtained when 25 product wafers were loaded (non-full load). For the oxidation processes performed to obtain the characteristic lines Z100 and Z25, the flow rates of $H_2$ and $O_2$ gases, process pressure, and process temperature were set the same.

As shown in FIG. 8A, in the case of the conventional apparatus, when it was with the full load of product wafers, the film thickness was essentially uniform over all the wafer positions, and thus the inter-substrate uniformity of the film thickness was good, as indicated by the characteristic line Y100. However, when the apparatus was with a non-full load of product wafers, the film thickness varied with an increase in the film thickness toward the downstream side of the gas flow, as indicated by the characteristic lines Y50 and Y25. This result means that an adjustment operation is required to optimize the flow rates of $O_2$ and $H_2$ gases in advance, along with a change in the number of product wafers.

On the other hand, as shown in FIG. 8B, in the case of the apparatus shown in FIG. 1, without reference to the full load and non-full load of product wafers, the film thickness essentially took on the target value, as indicated by the characteristic lines Z100 and Z25. Further, the film thickness was essentially uniform over all the wafer positions, and thus the inter-substrate uniformity of the film thickness was excellent. This result means that the process conditions (such as the gas flow rates) optimized for the full load of wafers can be used as they are even for a non-full load of wafers. Consequently, the adjustment operation for optimizing the flow rates can be simplified.

Modification

In the embodiment described above, the process field 25 is divided into five zones, which are respectively provided with five deoxidizing gas nozzles 52 to 60 having different lengths. However, the number of zones can be set at any number other than five, along with the corresponding number of nozzles having different lengths.

The process container 24 has the exhaust port 46 near the bottom so that gas flows inside the container from the upper side to the lower side. Alternatively, the process container 24 may have an exhaust port 46 at the top so that gas flows inside the container from the lower side to the upper side. Further, the process container 24 is not limited to a single-tube structure, and it may have a double-tube structure, which is formed of inner and outer tubes concentrically disposed.

The oxidizing gas is not limited to $O_2$, and it may comprise one or more gases selected from the group consisting of $O_2$, $N_2O$, $NO$, $NO_2$, and $O_3$. The deoxidizing gas is not limited to $H_2$, and it may comprise one or more gases selected from the group consisting of $H_2$, $NH_3$, $CH_4$, HCl, and deuterium.

The target substrate is not limited to a semiconductor wafer, and it may be another substrate, such as a glass substrate, LCD substrate, or ceramic substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An oxidation method for performing direct oxidation as a semiconductor process on a plurality of target substrates, the method comprising:
    placing the target substrates at intervals in a vertical direction within a process field of a process container;
    respectively supplying an oxidizing gas and a deoxidizing gas to the process field, while heating the process field;
    causing the oxidizing gas and the deoxidizing gas to react with each other, thereby generating oxygen radicals and hydroxyl group radicals within the process field; and
    performing an oxidation process of directly oxidizing a surface of the target substrates by use of the oxygen radicals and the hydroxyl group radicals,
    wherein the oxidizing gas is supplied through an oxidizing gas nozzle extending over a vertical length corresponding to the process field, and is spouted from a plurality of gas spouting holes formed on the oxidizing gas nozzle and arrayed over the vertical length corresponding to the process field, and
    the deoxidizing gas is supplied through a plurality of deoxidizing gas nozzles having different heights respectively corresponding to a plurality of zones of the process field arrayed vertically, and is spouted from gas spouting holes respectively formed on the deoxidizing gas nozzles each at height of a corresponding zone.

2. The method according to claim 1, wherein each of the gas spouting holes of the oxidizing gas nozzle and the deoxidizing gas nozzles has a gas spouting direction set in a tangential direction to a contour of the target substrate or in a direction outside the tangential direction.

3. The method according to claim 2, wherein the gas spouting direction is set to form an angle of 90° or more relative to a line connecting a center of a corresponding gas nozzle and a center of a corresponding target substrate.

4. The method according to claim 1, wherein the target substrates are held on a support member within the process field to fill the most upstream side of the support member, where the number of target substrates is smaller than that in a full load state of the support member.

5. The method according to claim 1, wherein the oxidizing gas comprises one or more gases selected from the group consisting of $O_2$, $N_2O$, $NO$, $NO_2$, and $O_3$, and the deoxidizing gas comprises one or more gases selected from the group consisting of $H_2$, $NH_3$, $CH_4$, HCl, and deuterium.

6. The method according to claim 1, wherein the method further comprises:
    obtaining reference conditions of the oxidation process for reference substrates each having a reference surface area, while satisfying a predetermined level of inter-substrate uniformity, each of the target substrates having a surface area with a certain ratio relative to the reference surface area; and
    determining actual conditions of the oxidation process to be used for the target substrates from the reference conditions, while adjusting essentially merely a process time thereof, in accordance with the certain ratio.

7. The method according to claim 6, wherein the inter-substrate uniformity is determined with reference to inter-substrate uniformity of thickness of a film formed by the oxidation process.

8. The method according to claim 6, wherein the reference conditions include flow rates of the oxidizing gas and the deoxidizing gas.

9. The method according to claim 1, wherein the deoxidizing gas nozzles are respectively connected to deoxidizing gas flow rate controllers, and the method further comprises respectively controlling flow rates of the deoxidizing gas flowing though the deoxidizing gas nozzles by the deoxidizing gas flow rate controllers.

10. The method according to claim 9, wherein the oxidizing gas nozzle is connected to a single oxidizing gas flow rate controller, and the method further comprises controlling a flow rate of the oxidizing gas flowing though the oxidizing gas nozzle by the oxidizing gas flow rate controller.

11. The method according to claim 1, wherein each of the deoxidizing gas nozzles has a set of gas spouting holes formed thereon and vertically arrayed within a corresponding zone.

\* \* \* \* \*